(12) United States Patent
Zoellin et al.

(10) Patent No.: US 9,335,203 B2
(45) Date of Patent: May 10, 2016

(54) MEMS COMPONENT

(71) Applicants: Jochen Zoellin, Muellheim (DE); Ricardo Ehrenpfordt, Korntal-Muenchingen (DE); Juergen Graf, Stuttgart (DE); Christoph Schelling, Stuttgart (DE); Frederik Ante, Stuttgart (DE); Michael Curcic, Stuttgart (DE)

(72) Inventors: Jochen Zoellin, Muellheim (DE); Ricardo Ehrenpfordt, Korntal-Muenchingen (DE); Juergen Graf, Stuttgart (DE); Christoph Schelling, Stuttgart (DE); Frederik Ante, Stuttgart (DE); Michael Curcic, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 335 days.

(21) Appl. No.: 14/012,804

(22) Filed: Aug. 28, 2013

(65) Prior Publication Data

US 2015/0059482 A1 Mar. 5, 2015

(51) Int. Cl.
*G01L 9/00* (2006.01)
*G01H 11/06* (2006.01)
*G01H 13/00* (2006.01)

(52) U.S. Cl.
CPC ............... *G01H 11/06* (2013.01); *G01H 13/00* (2013.01); *G01L 9/0019* (2013.01); *B81B 2201/0264* (2013.01)

(58) Field of Classification Search
CPC ................ G01P 9/0019; G01L 9/0019; B81B 2201/0264
USPC ............................................................. 73/702
See application file for complete search history.

(56) References Cited

U.S. PATENT DOCUMENTS

| | | | | |
|---|---|---|---|---|
| 5,747,705 A | * | 5/1998 | Herb ...................... | G01L 9/0019 73/862.59 |
| 6,182,513 B1 | * | 2/2001 | Stemme ................ | G01L 9/0016 73/704 |
| 2013/0047746 A1 | * | 2/2013 | Nakamura ............ | G01L 9/0019 73/862.59 |

* cited by examiner

*Primary Examiner* — John Chapman, Jr.
(74) *Attorney, Agent, or Firm* — Norton Rose Fulbright US LLP

(57) ABSTRACT

A new signal acquisition concept is provided for MEMS components having a pressure-sensitive diaphragm element, which at least partially spans a pressure connection opening. This signal acquisition concept is distinguished by an especially high sensitivity. For this purpose, the MEMS component includes a resonant vibrator device having a vibrating element, which is suspended, capable of vibrating, within a closed cavity and is equipped with at least one drive electrode and at least one sensing electrode. The vibrating element of the resonant vibrator device is coupled mechanically to the diaphragm element, so that the vibrating element is deformed in the case of a diaphragm deflection.

7 Claims, 4 Drawing Sheets

MEMS COMPONENT

FIELD OF INVENTION

The present invention relates to a MEMS component having a pressure-sensitive diaphragm element which at least partially spans a pressure connection opening.

BACKGROUND INFORMATION

Such MEMS components may be used for pressure measurements or as microphones, depending on the design of the diaphragm element. The signal detection takes place mostly capacitively, in this instance. For this purpose, the diaphragm element is configured as a movable electrode, which forms a capacitor system together with at least one fixed counter-electrode.

Such a microphone component is described, for example, in U.S. Pat. No. 6,535,460. The design of this microphone component includes a substrate, having a sound opening, which is spanned by a diaphragm. A perforated counter-element is situated above the diaphragm, at a distance from it, and is connected to the substrate in the edge region of the sound opening. The diaphragm and the counter-element jointly form a microphone capacitor, the diaphragm acting as a movable electrode, while the stationary counter-element is equipped with a rigid counter-electrode.

SUMMARY

The present invention relates to a new signal acquisition concept for MEMS components of the type mentioned at the outset, which stands out because of its particularly great sensitivity.

The signal acquisition takes place with the aid of a resonant vibrator device. The latter includes a vibrating element which is suspended, capable of vibrating, within a closed cavity and is equipped with at least one drive electrode and at least one sensing electrode. The vibrating element of the resonant vibrator device is coupled mechanically to the diaphragm element such that, in the case of a diaphragm deformation, it also experiences deformation.

The signal acquisition concept according to the present invention is based on the fact that the resonant frequency changes when the vibrating element is deformed. According to the present invention, use is made of the fact that such shifts in the resonant frequency are able to be recorded very accurately with measuring techniques, provided the resonant vibrator device has a high quality factor, a sharp resonant frequency. In order to be able to utilize the shift in the resonant frequency of the resonant vibrator device as the measuring signal, the diaphragm deflections or deformations are transmitted by mechanical coupling to the vibrating element. In order to achieve a high quality factor, the vibrating element is suspended in a closed volume of the resonant vibrator device.

Since particularly high vibrator qualities are able to be achieved in vacuum-encapsulated cavities, the vibrating element of the MEMS component according to the present invention is preferably suspended within a vacuum cavity.

Basically, there are many possibilities for implementing a MEMS component according to the present invention, especially as far as the layout of the diaphragm element, the mechanical coupling between the diaphragm element and the vibrating element of the resonant vibrator device and the resonant vibrator device itself are concerned.

In one preferred exemplary embodiment of the present invention, the mechanical coupling between the diaphragm element and the vibrating element is produced via the wall that borders the closed volume of the resonant vibrator device. In this case, at least a section of the diaphragm element is integrated into the wall of the cavity of the resonant vibrator device. The vibrating element is advantageously suspended asymmetrically between this first wall section and an opposite wall section of the cavity, so that diaphragm deformations result less in an excursion than in an upsetting or a stretching of the vibrating element.

The greater the deformation of the diaphragm section to which the resonant vibrator device is coupled, the greater is the acquirable measuring signal. In a meaningful manner, the resonant vibrator device is therefore positioned at a diaphragm region which is particularly greatly deformed in response to the effect of pressure.

In this connection, it has proven advantageous if the center region of the diaphragm element is stiffened, so that diaphragm deformations preferably occur in the edge region of the diaphragm element. The resonant vibrator device is then meaningfully situated in the edge region of the diaphragm element.

The deformability may, however, also be promoted by corrugations in a section of the diaphragm element, so that the resonant vibrator device is then meaningfully situated in the corrugation area of the diaphragm element. In one particularly advantageous exemplary embodiment variant of the present invention, corrugations are formed in the edge region of the diaphragm element.

The remaining wall sections of the closed volume of the resonant vibrator device should be as flexible as possible, in order to impair the mobility of the diaphragm element as little as possible. For this purpose, in one advantageous exemplary refinement of the present invention, corrugations are also formed at least in the wall section of the cavity lying opposite the diaphragm element.

The robustness and the service life of a MEMS component according to the present invention are able to be increased considerably if the micromechanical patterning is equipped with an overload protection for the diaphragm element, which borders the excursions of the diaphragm element as much as possible on both sides. Such an overload protection is advantageously integrated into the patterning of the diaphragm element.

In one exemplary embodiment variant having overload protection, the diaphragm element is bound into the component design in the manner of a paddle, i.e., only on one side. At the free end of the diaphragm element, a U-shaped profile is developed which encompasses a projection in the edge region of the pressure connection opening, and, together with this projection, forms a two-sided overload protection.

This component variant is particularly suitable for micromechanical applications since, in this case, pressure equalization takes place between the two sides of the diaphragm element. In this instance, the overload protection is additionally able to take over the function of an air leakage flow seal and be configured accordingly.

The MEMS component according to the present invention is advantageously implemented in a layer construction on a semiconductor substrate. For this purpose, a pressure connection opening is produced on the back side of the semiconductor substrate, which extends through the semiconductor substrate up to a diaphragm layer. The diaphragm element is developed in this layer of the layer construction. The vibrating element having the drive electrodes and the sensing electrodes of the resonant vibrator device is, for example, patterned out from at least one semiconductor layer over the diaphragm layer. Above the semiconductor layer of the vibrating element there is located at least one further layer, which borders the cavity of the resonant vibrator device from above. The suspension of the vibrating element is patterned out of the layer construction, so that the vibrating element is suspended asymmetrically between the diaphragm layer and the additional layer and, in the case of a diaphragm deformation, is stretched or upset preferably within the plane of the semiconductor layer.

As was previously pointed out, there are various possibilities for embodying and further developing the disclosure of the present invention in an advantageous manner. In this regard, reference is made to the following description of exemplary embodiments of the present invention with reference to the accompanying figures.

DETAILED DESCRIPTION

Figure 1A:
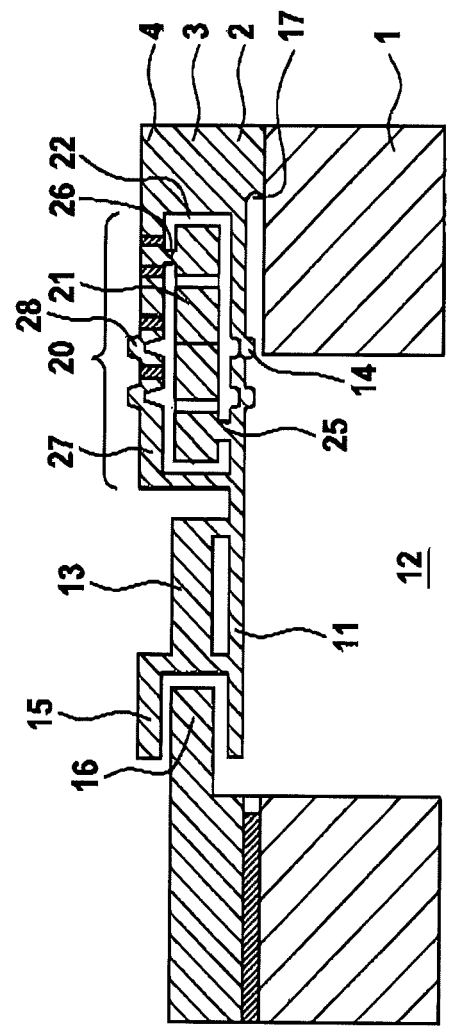
FIG. 1a shows a schematic sectional view through the layer construction of a microphone component 10 along the sectional axis A-A shown in FIG. 1b.
Figure 1B:
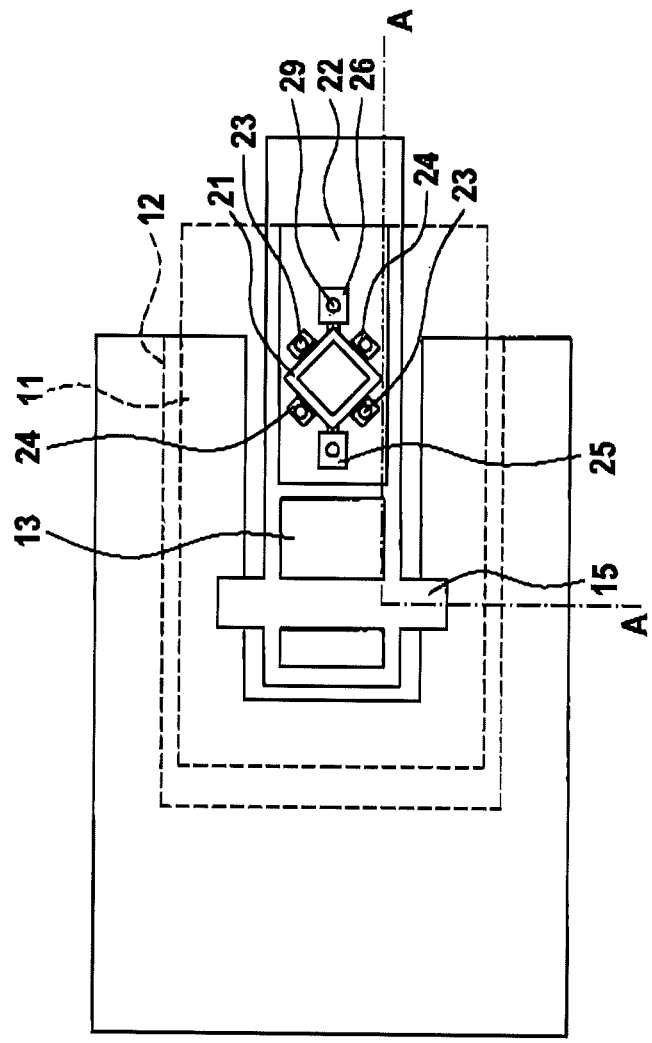
FIG. 1b shows a schematic top view onto microphone component 10 having sectional axis A-A.

MEMS component 10 shown in FIGS. 1a and 1b is a microphone component. The microphone patterning is implemented in a layer construction on a semiconductor substrate 1, which is illustrated particularly in FIG. 1a. It includes an acoustically active diaphragm element 11, which is patterned out from a diaphragm layer 2 of the layer construction, and spans a sound opening 12, which extends from the back side of the substrate diaphragm layer 2 of the layer construction.

Diaphragm element 11 is bound at right angles and, in the form of a paddle, only on one side into the layer construction of microphone component 10, so that a slow pressure equalization takes place via the diaphragm edge that is not bound between the two sides of diaphragm element 11. In response to the effect of sound pressure, diaphragm element 11 is deformed and deflected from its layer plane. In the process, the free end experiences the strongest deflection and practically no deformation, while the end bound into the layer construction is deformed the most. In the exemplary embodiment described here, this effect is even reinforced, for one thing, by a reinforcing element 13 in the center region, and for another, by corrugations 14 in the deformation region of diaphragm element 11.

The deflections of diaphragm element 11 are detected with the aid of a resonant vibrator device 20, according to the present invention. An essential component of resonant vibrator device 20 is a vibrating element 21, which is suspended within a closed cavity 22 capable of vibrating. Furthermore, in the exemplary embodiment shown here, resonant vibrator device 20 includes two drive electrodes 23 for exciting vibrating element 21 and two sensing electrodes 24 for detecting the vibrational frequency of vibrating element 21. The positioning of electrodes 23 and 24 within cavity 22 is clarified particularly by FIG. 1b. A vacuum prevails inside cavity 22, which contributes to the resonant vibrator device having a sharp resonant frequency, that is, a high quality factor. The resonant frequency should amount to clearly more than 20 kHz.

According to the present invention, vibrating element 21 of resonant vibrator device 20 is coupled mechanically to diaphragm element 11, such that vibrating element 21 also experiences a deformation in the case of a diaphragm deflection or deformation.

In the exemplary embodiment described here, this mechanical coupling is achieved in that the deformation region of diaphragm element 11 is integrated in the wall of cavity 22 of resonant vibrator device 20. The diaphragm deformations in this case are transmitted via suspension crosspieces 25 and 26 to the parallelepiped-shaped or spar-shaped vibrating element 21, by which the latter is suspended between diaphragm element 11 and an opposite wall section 27. For this purpose, suspension crosspiece 25 connects the corner of vibrating element 21, which extends into the diaphragm region, to diaphragm element 11 below vibrating element 21, while suspension crosspiece 26 connects the opposite corner of vibrating element 21 to opposite wall section 27 above vibrating element 21. Based on this asymmetrical suspension of vibrating element 21, deflections or deformations of diaphragm element 11 lead, in first place, to a stretching or an upsetting of vibrating element 21 within its layer plane.

Figure 2A:
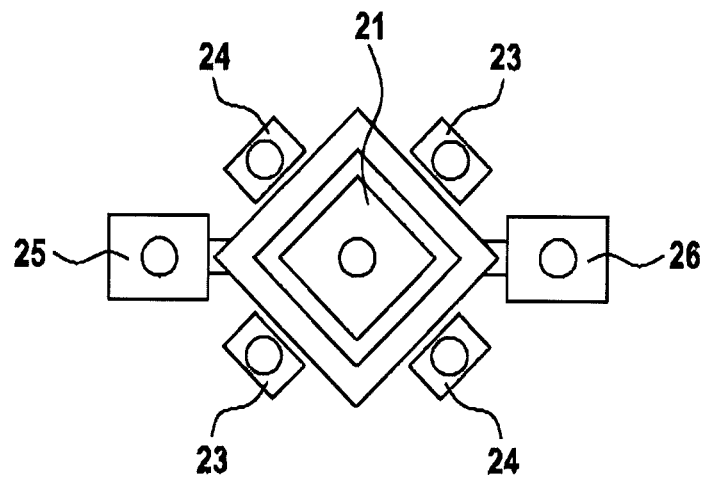
FIGS. 2a-2c show schematic top views onto the vibrating element of a resonant vibrator device for signal acquisition a) at rest, as well as in the case of a diaphragm deformation b) downwards and c) upwards.
Figure 2B:
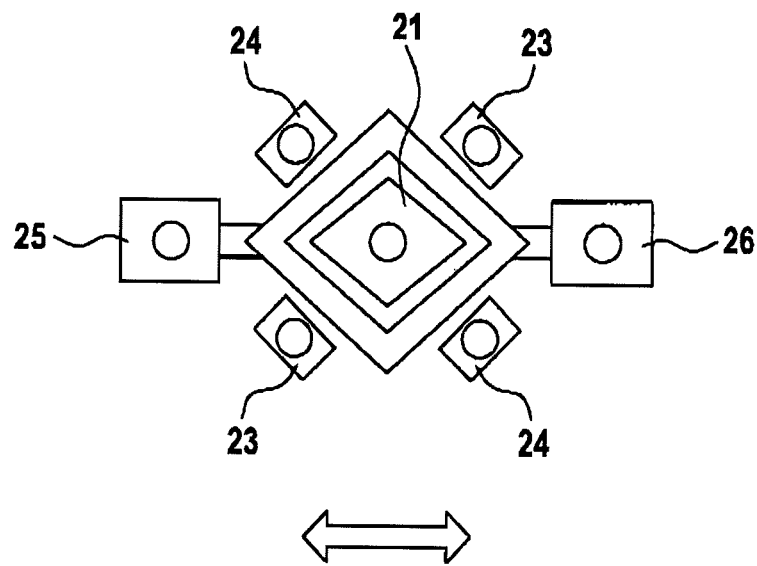
Figure 2C:
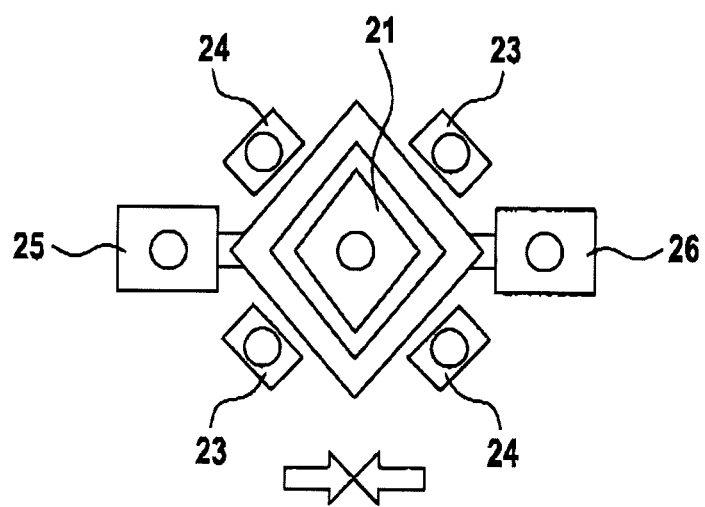

This is illustrated by the detailed views of vibrating element 21 in FIGS. 2a to 2c. FIG. 2a shows vibrating element 21 with the two drive electrodes 23 and the two sensing electrodes 24 in the at rest state, that is, when diaphragm element 11 is located within the diaphragm plane and is not deflected. In this case, vibrating element 21 is parallelepiped-shaped, having a square base plane. If diaphragm element 11 is deflected downwards, vibrating element 21, based on its asymmetrical suspension, experiences a stretching deformation within its layer plane, which is shown in FIG. 2b. The base area of vibrating element 21 in this case is pulled apart in rhombic fashion in comparison to FIG. 2a. In contrast to this, vibrating element 21 is compressed within its layer plane if diaphragm element 11 is deflected upwards. This is shown in FIG. 2c, where the base area of vibrating element 21 is pushed together in rhombic fashion in comparison to FIG. 2a.

In contrast to out-of-plane displacements of vibrating element 21, the stretching-like deformations described above lead to a change in the resonant frequency of the resonant vibrator device, which one is able to detect very well. The electrical contacting of resonant vibrator device 20, required for this, takes place via electrical terminals 29 on suspension crosspieces 25 and 26.

In order not to reinforce the deformation region of the diaphragm element at the cost of microphone sensitivity, the wall of cavity 22 should overall be designed to be as flexible as possible. For this, in the exemplary embodiment described here, corrugations 28 are also developed in wall section 27.

Moreover, the micromechanical patterning of MEMS component 10, shown in FIGS. 1a and 1b, includes an overload protection for diaphragm element 11. For this, a U-shaped profile type of stop element 15 is developed at the free end of diaphragm element 11, which encompasses a projection 16 in the edge region of sound opening 12. Thereby both the upwards and the downwards excursions of diaphragm element 11 are limited. In addition, stop element 15 together with projection 16 forms an air leakage flow seal for microphone component 10.

As was mentioned before, FIG. 1a illustrates the layer construction of the microphone patterning of component 10. Diaphragm layer 2 was underetched isotropically in the linking region of diaphragm element 11, so that cavity 17, which extends below diaphragm element 11 over the edge of sound opening 12, has rounded edges. This contributes to the robustness and breaking strength of the diaphragm link. Vibrating element 21, having drive electrodes 23 and sensing electrodes 24, was patterned out of a semiconductor layer 3 over diaphragm layer 2. In this semiconductor layer 3, reinforcing element 13 in the center region of diaphragm element 11 and projection 16 in the edge region of sound opening 12 were also developed. Above these, there is located at least one further layer 4, in which upper wall section 27 of resonant vibrator device 20 as well as the upper part of the U-shaped profile-like stop element 15 are implemented. The individual patterned elements of the microphone patterning were exposed by the patterning of layers 2, 3 and 4 and by the etching of sacrificial layers. The sacrificial layers of the layer construction, which are situated between layers 2, 3 and 4, are not shown in detail, in this instance.

What is claimed is:

1. A MEMS component, comprising:
   a pressure-sensitive diaphragm element, which spans a pressure connection opening at least partially, and
   a resonant vibrator device, having a vibrating element, which is suspended, capable of vibrating, within a closed cavity and is equipped with at least one drive electrode and at least one sensing electrode,
   wherein the vibrating element of the resonant vibrator device is coupled mechanically to the diaphragm element, so that the vibrating element is deformed in a case of a diaphragm deflection, and
   wherein at least one section of the diaphragm element is integrated into a first wall section of the cavity of the resonant vibrator device; and the vibrating element is asymmetrically suspended via a first suspension crosspiece that connects to the diaphragm element and a second suspension crosspiece that connects to an opposite wall section of the cavity lying opposite the diaphragm element.

2. The MEMS component according to claim 1, wherein the vibrating element is suspended in a vacuum cavity.

3. The MEMS component according to claim 1, wherein a center region of the diaphragm element is reinforced, so that diaphragm deformations occur in an edge region of the diaphragm element; and the resonant vibrator device is coupled mechanically to the edge region of the diaphragm element.

4. The MEMS component according to claim 1, wherein corrugations are configured in the diaphragm element which promote a deformation.

5. A MEMS component, comprising:
   a pressure-sensitive diaphragm element, which spans a pressure connection opening at least partially, and
   a resonant vibrator device, having a vibrating element, which is suspended, capable of vibrating, within a closed cavity and is equipped with at least one drive electrode and at least one sensing electrode,
   wherein the vibrating element of the resonant vibrator device is coupled mechanically to the diaphragm element, so that the vibrating element is deformed in a case of a diaphragm deflection,
   wherein at least one section of the diaphragm element is integrated into a first wall section of the cavity of the resonant vibrator device, and the vibrating element is asymmetrically suspended between the first wall section and an opposite wall section of the cavity, and
   wherein corrugations are configured in the opposite wall section of the cavity lying opposite the diaphragm element.

6. A MEMS component, comprising:
   a pressure-sensitive diaphragm element, which spans a pressure connection opening at least partially, and
   a resonant vibrator device, having a vibrating element, which is suspended, capable of vibrating, within a closed cavity and is equipped with at least one drive electrode and at least one sensing electrode,
   wherein the vibrating element of the resonant vibrator device is coupled mechanically to the diaphragm element, so that the vibrating element is deformed in a case of a diaphragm deflection, and
   wherein the diaphragm element is a cantilever having a fixed end integrated into a first wall section of the cavity of the resonant vibrator device and a free end that has a U-shaped profile which encompasses a projection in an edge region of the pressure connection opening and forms an overload protection together with the projection.

7. The MEMS component according to claim 1, wherein the pressure connection opening is configured in a back side of a substrate; and the diaphragm element and the resonant vibrator device are implemented in a layer construction on the substrate,
   wherein the pressure connection opening extends through the substrate up to a diaphragm layer of the layer construction, in which the diaphragm element is configured; the vibrating element having the drive electrodes and the sensing electrodes is patterned out from at least one semiconductor layer over the diaphragm layer; over semiconductor layer of the vibrating element, at least one additional layer is located, which limits the cavity of the resonant vibrator device from above; and a suspension of the vibrating element is patterned out from the layer construction, so that the vibrating element is suspended asymmetrically between the diaphragm layer and the additional layer and, in a case of a diaphragm deformation, the vibrating element is stretched or upset within a plane of the semiconductor layer.

* * * * *